(12) United States Patent
Sato

(10) Patent No.: US 8,988,150 B2
(45) Date of Patent: Mar. 24, 2015

(54) AMPLIFIER AND AMPLIFICATION METHOD

(71) Applicant: Fujitsu Limited, Kawasaki-shi (JP)

(72) Inventor: Masaru Sato, Isehara (JP)

(73) Assignee: Fujitsu Limited, Kawasaki (JP)

( * ) Notice: Subject to any disclaimer, the term of this patent is extended or adjusted under 35 U.S.C. 154(b) by 77 days.

(21) Appl. No.: 13/740,246

(22) Filed: Jan. 13, 2013

(65) Prior Publication Data

US 2013/0234798 A1    Sep. 12, 2013

(30) Foreign Application Priority Data

Mar. 12, 2012  (JP) .................................. 2012-54448

(51) Int. Cl.
| | |
|---|---|
| *H03F 3/68* | (2006.01) |
| *H03F 3/16* | (2006.01) |
| *H03F 1/08* | (2006.01) |
| *H03F 1/56* | (2006.01) |
| *H03F 3/193* | (2006.01) |

(52) U.S. Cl.
CPC .................. *H03F 3/16* (2013.01); *H03F 1/086* (2013.01); *H03F 1/565* (2013.01); *H03F 3/193* (2013.01)

USPC ............................ 330/310; 330/165; 330/188

(58) Field of Classification Search
USPC ........................... 330/188, 195, 302, 310, 165
See application file for complete search history.

(56) References Cited

U.S. PATENT DOCUMENTS

| | | | | |
|---|---|---|---|---|
| 2,928,050 | A | * | 3/1960 | Luft .............................. 330/296 |
| 2,966,633 | A | * | 12/1960 | Cannon ........................ 330/276 |
| 3,895,306 | A | * | 7/1975 | Rebeles ....................... 330/271 |
| 6,271,721 | B1 | * | 8/2001 | Trask ............................ 327/560 |

FOREIGN PATENT DOCUMENTS

| | | |
|---|---|---|
| JP | 2006-521748 | 9/2006 |
| WO | WO-2004/086608 | 10/2004 |

* cited by examiner

*Primary Examiner* — Steven J Mottola
(74) *Attorney, Agent, or Firm* — Fujitsu Patent Center

(57) ABSTRACT

An amplifier includes a transformer including a primary coil whose one end is connected to an input port and whose other end is connected to reference potential and a secondary coil magnetically-coupled with the primary coil, and a transistor including a source connected to one end of the secondary coil and a gate connected to other end of the secondary coil and a drain connected to an output port side.

2 Claims, 16 Drawing Sheets

AMPLIFIER AND AMPLIFICATION METHOD

CROSS-REFERENCE TO RELATED APPLICATION

This application is based upon and claims the benefit of priority of the prior Japanese Patent Application No. 2012-54448, filed on Mar. 12, 2012, the entire contents of which are incorporated herein by reference.

FIELD

The embodiments discussed herein are related to a amplifier and an amplification method.

BACKGROUND

A common-source amplifier providing both a high gain and high input impedance is an amplifier most frequently in use. However, when an input signal frequency becomes high, the gain of the common-source amplifier sharply decreases because of a Miller effect.

The Miller effect may be suppressed by a cross-coupled differential amplifier in which a pair of common-source amplifiers is cross-coupled by capacitors. (For example, refer to Japanese Laid-open Patent Publication No. 2006-521748.)

However, the cross-coupled differential amplifier has a problem of large power consumption because two common-source amplifiers are driven.

SUMMARY

According to an aspect of the embodiments, an amplifier includes a transformer including a primary coil whose one end is connected to an input port and whose other end is connected to reference potential and a secondary coil magnetically-coupled with the primary coil, and a transistor including a source connected to one end of the secondary coil and a gate connected to other end of the secondary coil and a drain connected to an output port side.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Preferred embodiments will be explained with referenced to accompanying drawings. Here, identical symbols are given to corresponding parts even in different drawings, and the description thereof will be omitted.

According to the present device, it is possible to provide an amplifier operated with small power while the Miller effect is suppressed.

(1) Structure

Figure 1:
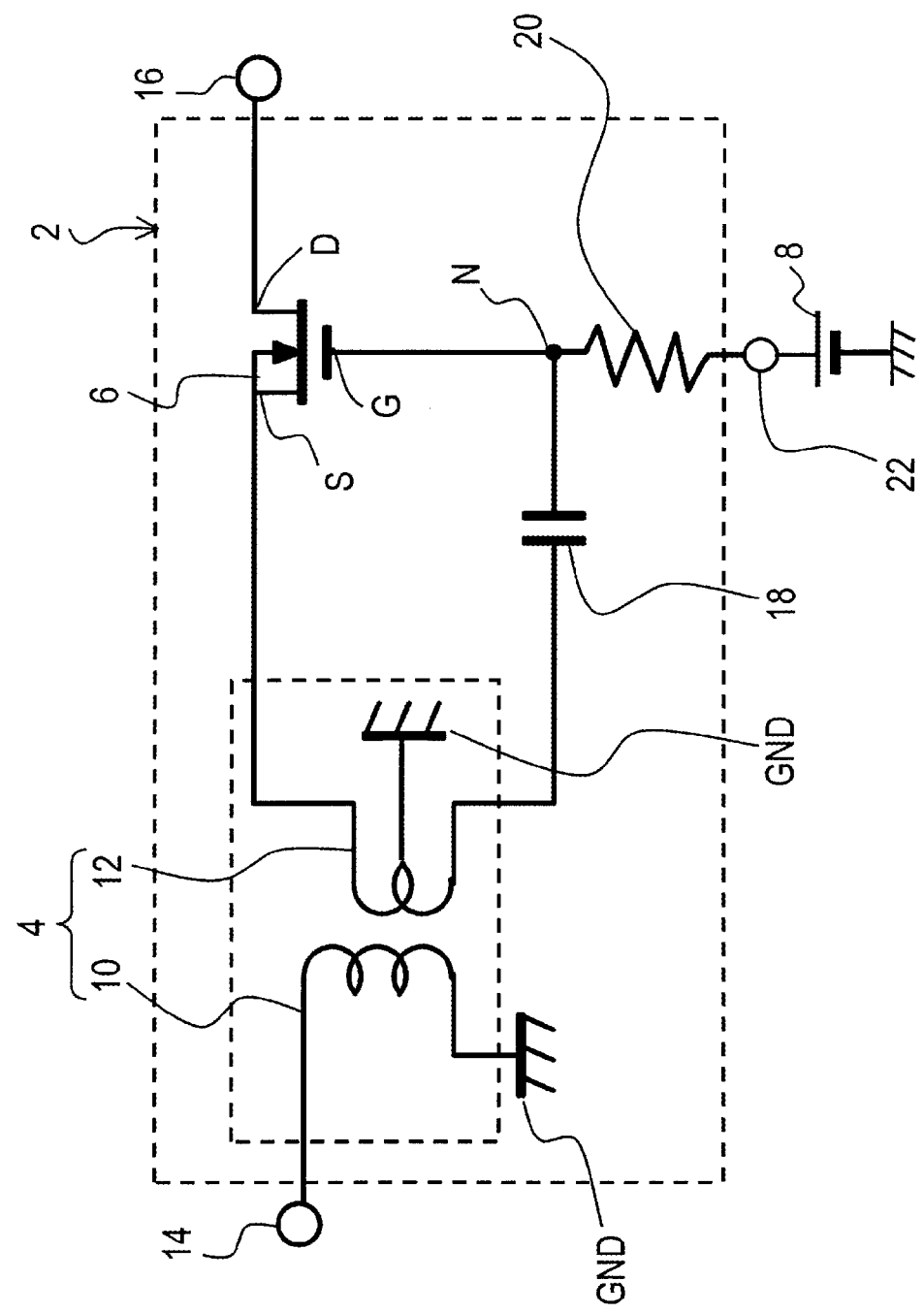
FIG. 1 is a circuit diagram of an amplifier according to an embodiment.

FIG. 1 is a circuit diagram of an amplifier 2 according to an embodiment.

As depicted in FIG. 1, the amplifier 2 includes a transformer 4 and a transistor 6. Here, in FIG. 1, a bias power supply 8 for the transistor 6 is also depicted.

The transformer 4 includes a primary coil 10 and a secondary coil 12 magnetically-coupled with the primary coil 10.

One end of the primary coil 10 is connected to an input port (input terminal) 14, while the other end of the primary coil 10 is connected to reference potential (ground GND in the example of FIG. 1).

One end of the secondary coil 12 is connected to a source S of the transistor 6, while the other end of the secondary coil 12 is connected to a gate G of the transistor 6. Further, to a drain D of the transistor 6, an output port (output terminal) 16 is connected. A drive voltage of the transistor 6 is supplied to the drain D through the output port 16, for example.

As depicted in FIG. 1, the amplifier 2 further includes a capacitor 18 and a resistor 20. The capacitor 18 is disposed between the gate G of the transistor 6 and the secondary coil 12. To one end of the resistor 20, the bias power supply 8 is connected through a bias port (bias terminal) 22. The other end of the resistor 20 is connected to a node N between the capacitor 18 and the gate G.

A center portion of the secondary coil 12 is connected to the reference potential. Therefore, to the gate G of the transistor 6, a bias voltage generated by the bias circuit 8 is applied. Because the bias voltage is a direct-current voltage, the bias voltage is cut off by the capacitor 18, and is hardly applied to the secondary coil 12.

The resistance of the resistor 20 is sufficiently larger than the impedance (more precisely, the absolute value thereof, which is also applicable hereafter) of the transformer 4 at an input signal frequency. Further, capacitance of the capacitor 18 is high enough that impedance of the capacitor 18 is sufficiently smaller than that of the transformer 4 at the input signal frequency. Therefore, a high frequency signal generated between both ends of the secondary coil 12 in response to an input signal hardly flows into the bias circuit 8, and is supplied between the source S and the gate G of the transistor 6.

Here, the impedance of the transformer 4 means an impedance seen from the side of the transistor 6 when an input circuit is connected to the input port 14.

Each element (transformer or transistor) of the amplifier 2 is formed, for example, on a semiconductor substrate (Si substrate, for example). The transistor 6 is, for example, a MOS (Metal Oxide Semiconductor) field effect transistor formed on the semiconductor substrate. The primary coil 10 and the secondary coil 12 of the transformer 4 are loop-shaped wiring facing across an interlayer insulating film, for example. The capacitor 18 is a pair of electrodes facing across an interlayer insulating film, for example. The resistor 20 is an impurity diffused layer formed on the semiconductor substrate.

(2) Operation

First, the bias power supply 8 is activated so that a bias voltage is applied to the gate G of the transistor 6. Further, a drive power supply (not illustrated) for the transistor 6 is activated so that a drive voltage is applied to the drain D of the transistor 6 through the output port 16. In this state, a signal having a frequency of, for example, 10-100 GHz is input into the input port 14.

The signal input to the input port 14 is supplied to the primary coil 10 of the transformer 4. Then, the input signal is transmitted to the secondary coil 12 by magnetic coupling. The secondary coil 12 supplies the transmitted signal to between the source S and the gate G of the transistor 6.

The transistor 6 amplifies the signal which is supplied, and thereafter outputs the signal from the output port 16. At this time, a gate-to-drain capacitance of the transistor 6 resonates with a primary inductor of the transformer 4, so as to suppress the reduction of the gain caused by the Miller effect.

Figure 2A:
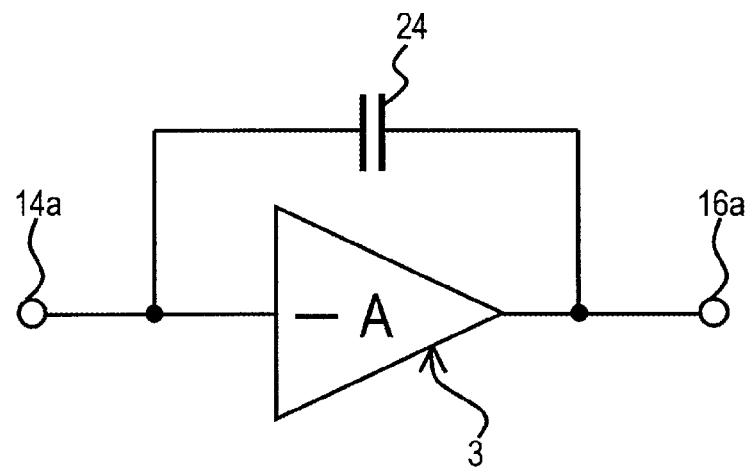
FIG. 2A is a diagram illustrating the Miller effect.
Figure 2B:
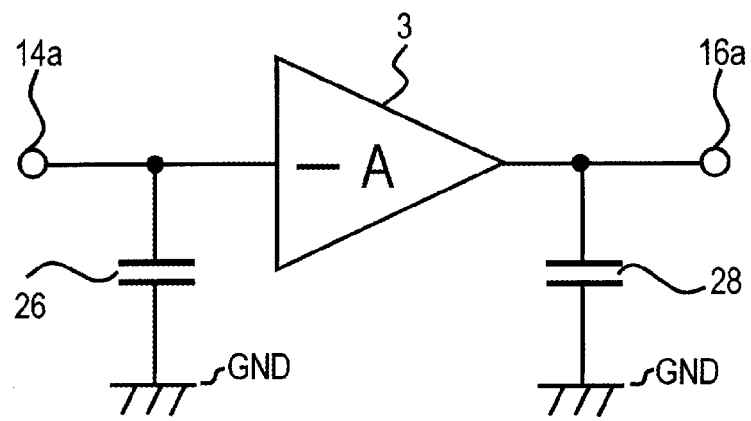
FIG. 2B is a diagram illustrating the Miller effect.

FIGS. 2A and 2B are diagrams illustrating the Miller effect.

As depicted in FIG. 2A, consider an amplifier 2a which includes a capacitor 24 connecting the input port 14a and an output port 16a and an amplifying element 3 disposed between the input port 14a and the output port 16a. The capacitance of the capacitor 24 is defined to be C.

Now, let a voltage amplification factor (voltage gain) and an input signal of the amplifying element 3 to be −A (<0) and $V_{in}$, respectively. Then, the output signal of the amplifying element 3 is −$AV_{in}$. Therefore, to both ends of the capacitor 24, a voltage of $(1+A)V_{in}$ (=$V_{in}$−(−$AV_{in}$)) is applied. This produces a current of $C(1+A)*d(V_{in})/dt$ flowing into the capacitor 24 (t is time) from the input port 14a.

Therefore, when seen from the input port 14a, the amplifier 2a depicted in FIG. 2A is equivalent to a circuit in which a capacitor (hereafter referred to as Miller capacitor) 26 having capacitance of C(1+A) is connected between the input port 14a and reference potential (in FIG. 2B, ground GND). By this, the higher the frequency of the input signal is, the smaller the input impedance of the amplifier 2a becomes and the smaller the gain of the amplifier 2a becomes. This is known as the Miller effect.

In addition, when seen from the output port 16a, the amplifier 2a depicted in FIG. 2A is equivalent to a circuit in which a capacitor 28 having capacitance of C(1+1/A) is connected between the output port 16a and the reference potential (refer to FIG. 2B).

Figure 3A:
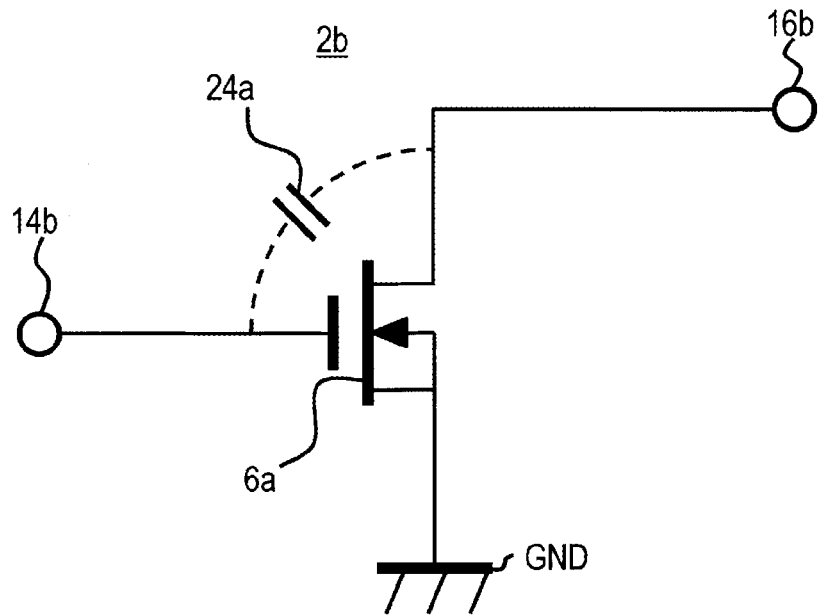
FIG. 3A is a diagram illustrating the Miller effect of the common-source amplifier.
Figure 3B:
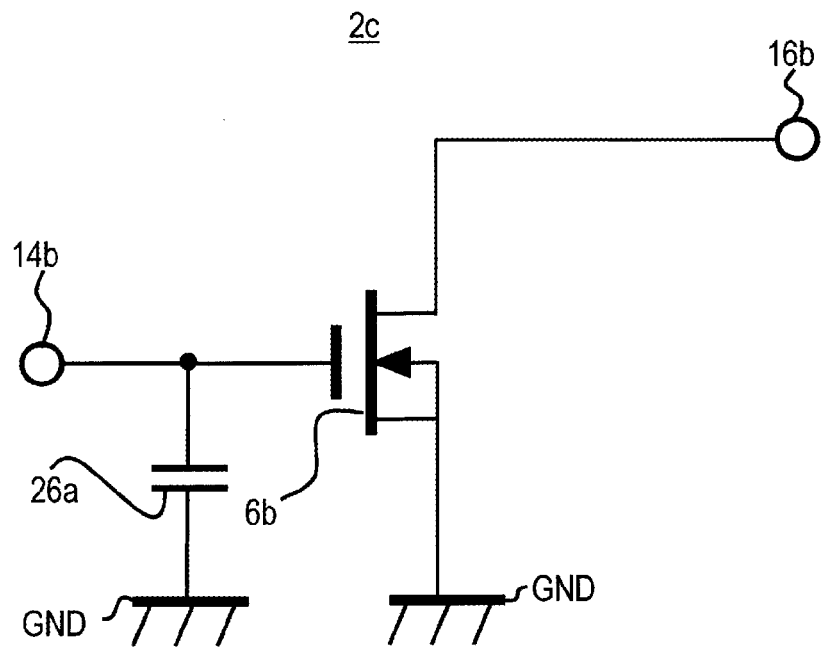
FIG. 3B is a diagram illustrating the Miller effect of a common-source amplifier.

FIGS. 3A and 3B are diagrams illustrating the Miller effect of a common-source amplifier. In FIG. 3A, a common-source amplifier 2b is depicted. In FIG. 3B, an equivalent circuit 2c of the common-source amplifier 2b (amplifying element) is depicted. Here, bias circuits etc. are not illustrated in these figures.

As depicted in FIG. 3A, in the common-source amplifier 2b, an input port 14b is connected to an output port 16b by gate-to-drain capacitance 24a of a transistor 6a. The voltage amplification factor of the transistor 6a is negative. Thus, it is possible to make the gate-to-drain capacitance 24a correspond to the capacitor 24 depicted in FIG. 2A, and also to make the transistor 6a correspond to the amplifying element 3. As a result, if an input signal frequency becomes higher, the amplification factor of the common-source amplifier 2b becomes lower because of the Miller effect.

FIG. 3B illustrates an equivalent circuit 5 of the common-source amplifier 2b. The equivalent circuit includes a Miller capacitor 26a, which connects the input port 14b and the reference potential (in FIGS. 3A, 3B ground GND), and a transistor 6b. The transistor 6b is a transistor not including gate-to-drain capacitance.

A signal source (not illustrated) connected to the input port 14b and the Miller capacitor 26a configures a low-pass filter. Now, the cutoff frequency $f_C$ of a low-pass filter is represented by the following equation (1).

$$f_c = \frac{1}{2\pi \cdot C \cdot R} \quad (1)$$

where C is capacitance of the low-pass filter. R is resistance of the low pass filter.

In the low-pass filter configured by the common-source amplifier 2b and the signal source, C is capacitance of the Miller capacitor 26a, and R is internal resistance of the signal source.

As described above, the capacitance of the Miller capacitor 26a is (1+A) times as large as the capacitance of the gate-to-drain capacitance 24a. Therefore, C in equation (1) is exceedingly larger than the gate-to-drain capacitance. This produces an exceedingly low cutoff frequency of the low-pass filter which is configured by the common-source amplifier 2b and the signal source. Accordingly, when the input signal frequency becomes higher, the gain of the common-source amplifier 2b sharply decreases.

Additionally, the gate-to-source capacitance and the drain-to-source capacitance of the transistor 6a are of the same degree as the gate-to-drain capacitance 24a. However, the gate-to-source capacitance and the drain-to-source capacitance are not amplified by the voltage amplification factor of the transistor. Therefore, both of the above capacitance produce a small influence upon a frequency characteristic of the common-source amplifier 2b.

Figure 4:
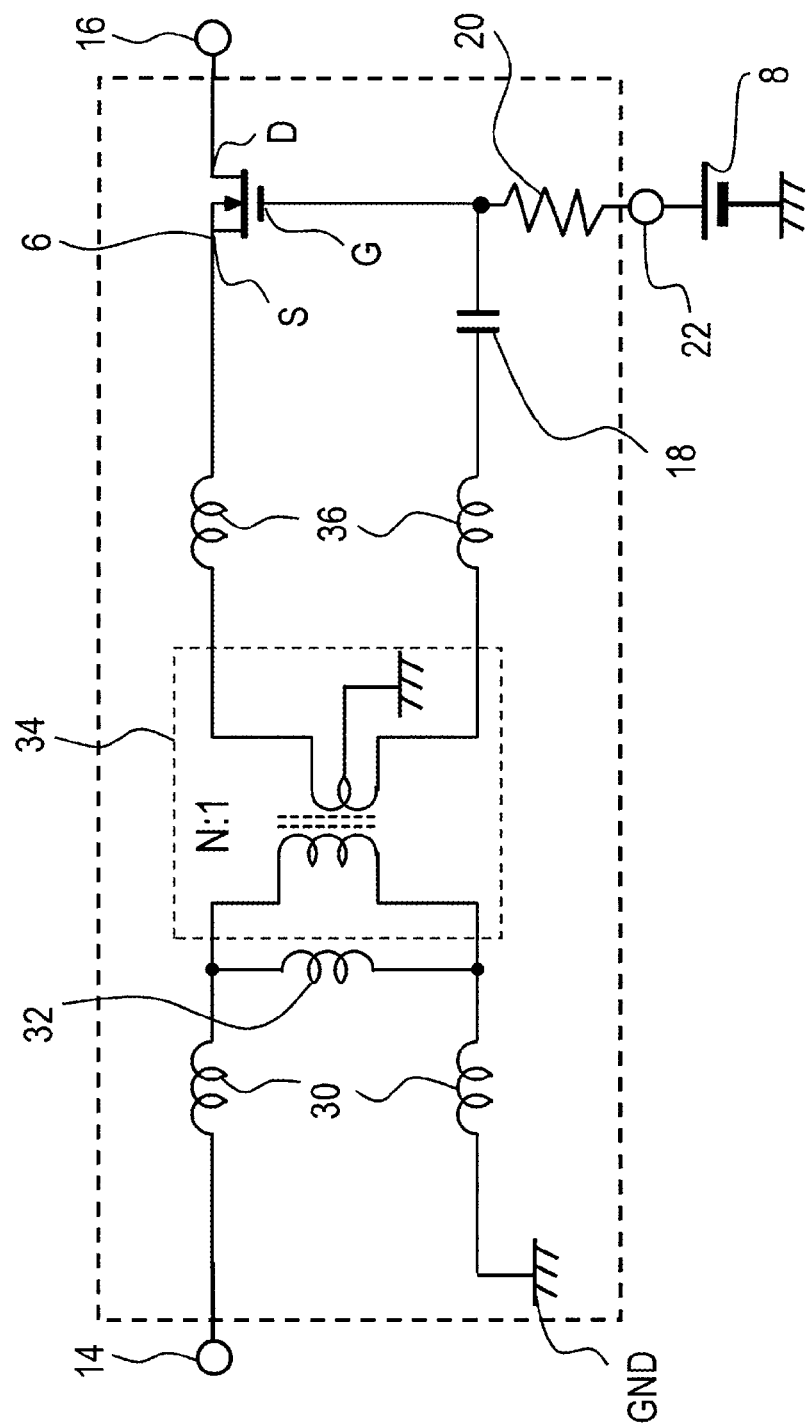
FIG. 4 is a circuit diagram in which the transformer in the amplifier according to the embodiment is represented by an equivalent circuit.

FIG. 4 is a circuit diagram in which the transformer 4 in the amplifier 2 (refer to FIG. 1) according to the embodiment is represented by an equivalent circuit. As depicted in FIG. 4, the transformer 4 is equivalent to a circuit which includes a primary coil leakage inductor 30, a primary inductor 32, an ideal transformer 34 and a secondary coil leakage inductor 36.

Inductance $L_1$ of the primary coil leakage inductor 30 and inductance $L_2$ of the secondary coil leakage inductor 36 are represented by equations (2) and (3), respectively.

$$L_1 = L_p \cdot \left(\frac{1}{k} - 1\right) \quad (2)$$

$$L_2 = \frac{L_1}{N^2} \quad (3)$$

where $L_P$ is the inductance (hereafter referred to as primary inductance) of the primary inductor 32, k is a coupling coefficient of the ideal transformer 34, and N is a winding ratio of the ideal transformer 34.

The coupling coefficient k is around 0.7, for example. The winding ratio N is around 1, for example. Therefore, the primary coil leakage inductor 30 and the secondary coil leakage inductor 36 are almost negligible.

Figure 5:
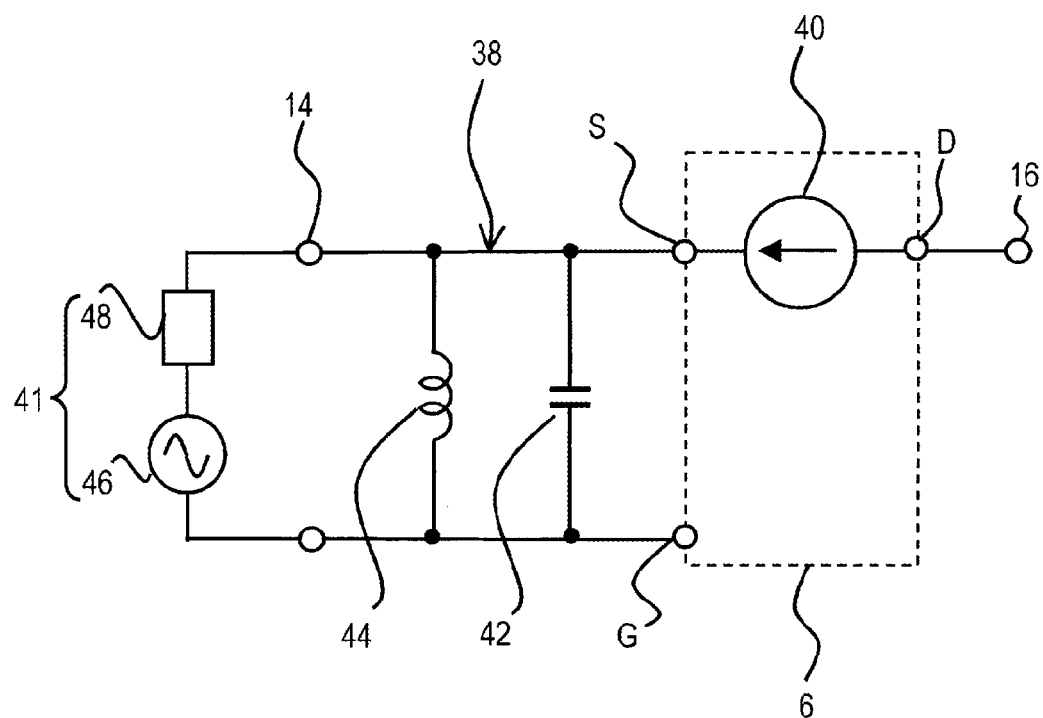
FIG. 5 is a small-signal equivalent circuit of the amplifier according to the embodiment.

FIG. 5 is a small-signal equivalent circuit 38 of the amplifier 2 based on the above approximation. In FIG. 5, there is also depicted a signal source 41 which supplies a signal to the small-signal equivalent circuit 38. The signal source 41 includes a voltage source 46 and internal impedance 48.

As depicted in FIG. 5, the small-signal equivalent circuit 38 includes a current source 40 corresponding to the transistor 6, a Miller capacitor 42 corresponding to the gate-to-drain capacitance of the transistor 6, and an equivalent inductor 44 corresponding to the primary inductor 32 of the transformer 4. The inductance of the equivalent inductor 44 is $1/N^2$ times the primary inductance $L_p$.

As depicted in FIG. 5, the Miller capacitor 42 and the equivalent inductor 44 are connected in parallel between the source S and the gate G of the transistor 6.

Accordingly, the equivalent inductor 44 resonates with the Miller capacitor 42 at a parallel resonance frequency (resonant frequency of a parallel circuit including an inductor and a capacitor). Then, the input impedance of the small-signal equivalent circuit 38 becomes infinite, which produces no current flow in the internal impedance 48 of the signal source 41.

At this time, the voltage of the voltage source 46 included in the signal source 41 is applied intact to between the gate and the source of the transistor 6. Therefore, the gain of the small-signal equivalent circuit 38 (that is, the gain of the amplifier 2) increases at the parallel resonance frequency. It is also similar in the vicinity of the parallel resonance frequency.

Now, a parallel resonance frequency $f_r$ is represented by equation (4).

$$f_r = \frac{1}{2\pi \cdot \sqrt{C \cdot L}} \quad (4)$$

where C is capacitance of the parallel resonant circuit. L is inductance of the parallel resonant circuit.

In the circuit depicted in FIG. 5, C is the capacitance of the Miller capacitor 42. L is the inductance of the equivalent inductor 44 (=$L_p/N^2$). Therefore, as is apparent from equation (4), the smaller the primary inductance $L_p$ of the transformer 4 is, the higher the resonant frequency $f_r$ becomes.

The primary inductance $L_p$ is substantially proportional to areas of the primary coil 10 and the secondary coil 12 of the transformer 4. Therefore, by reducing the areas of the primary coil 10 and the secondary coil 12, it is possible to make the amplification factor of the amplifier 2 become large at a higher frequency.

(3) Frequency Characteristic

Figure 6:
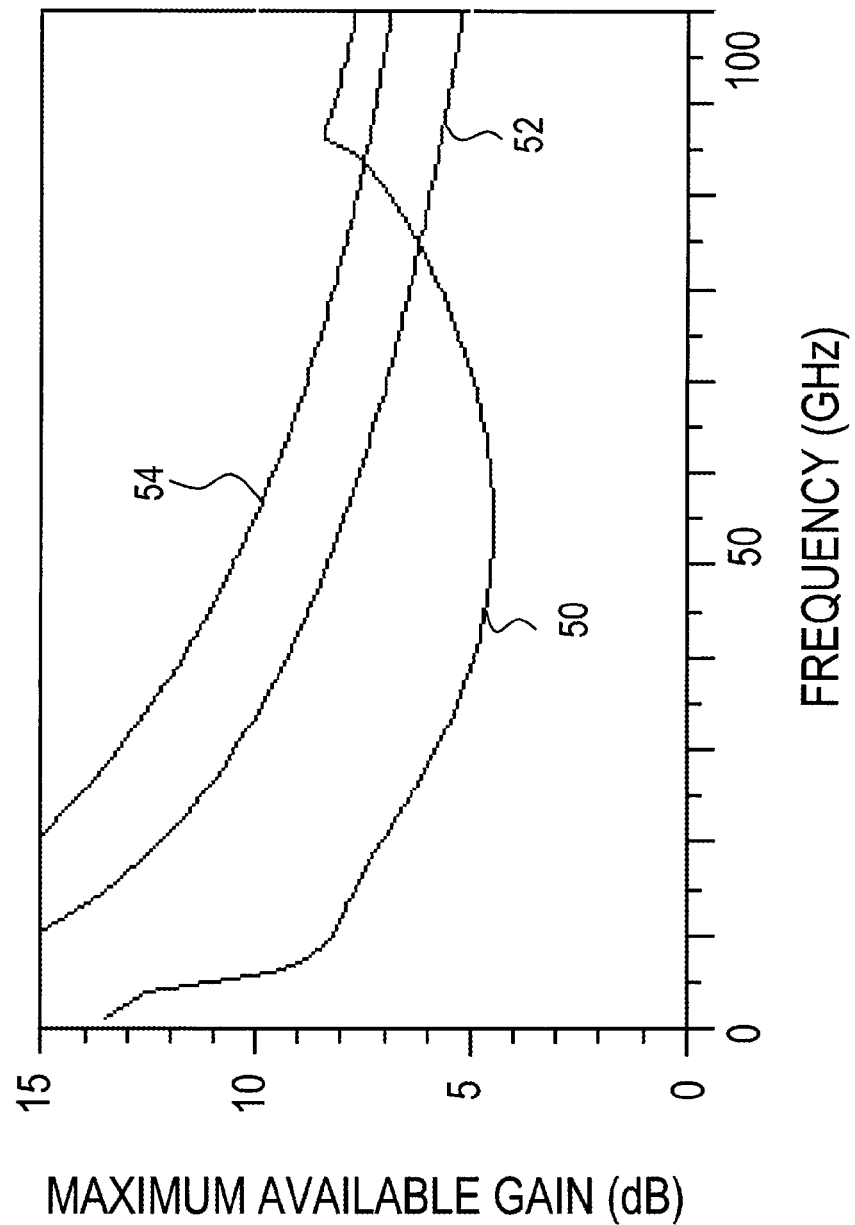
FIG. 6 illustrates a frequency characteristic of the amplifier according to the embodiment.

FIG. 6 illustrates a frequency characteristic of the amplifier 2 according to the embodiment. The horizontal axis denotes an input signal frequency. The vertical axis denotes a maximum available gain. In FIG. 6, there are depicted the frequency characteristic 50 of the amplifier 2, along with a frequency characteristic 52 of the common-source amplifier and a frequency characteristic 54 of the cross coupled differential amplifier.

The frequency characteristic depicted in FIG. 6 is obtained by simulation using a transistor model (which is also applicable to frequency characteristics described below). In the simulation of FIG. 6, it is assumed that each element common to each amplifier (transistor, for example) has common parameter values. The parameter values of the transistor used in the simulation are represented in Table 1. The capacitance of the cross-coupled capacitor is 10 fF.

TABLE 1

| Transistor parameters used in simulation | |
|---|---|
| Transistor parameters | Parameter values |
| Transconductance $g_m$ | 40 mS |
| Gate-to-source capacitance $C_{gs}$ | 40 fF |
| Gate-to-drain capacitance $C_{gd}$ | 10 fF |
| Drain-to-source capacitance $C_{ds}$ | 40 fF |
| Output resistance $R_{ds}$ | 200 Ω |

As depicted in FIG. 6, a gain 52 of the common-source amplifier monotonically decreases as a signal frequency increases. On the other hand, a gain 50 of the amplifier 2 according to the embodiment becomes maximal in a high frequency range (in FIG. 6, in the vicinity of 95 GHz), and becomes greater than the gain 52 of the common-source amplifier. Also, in the high frequency range, the gain 50 of the amplifier 2 is greater than the gain 54 of the cross coupled differential amplifier.

Figure 7:
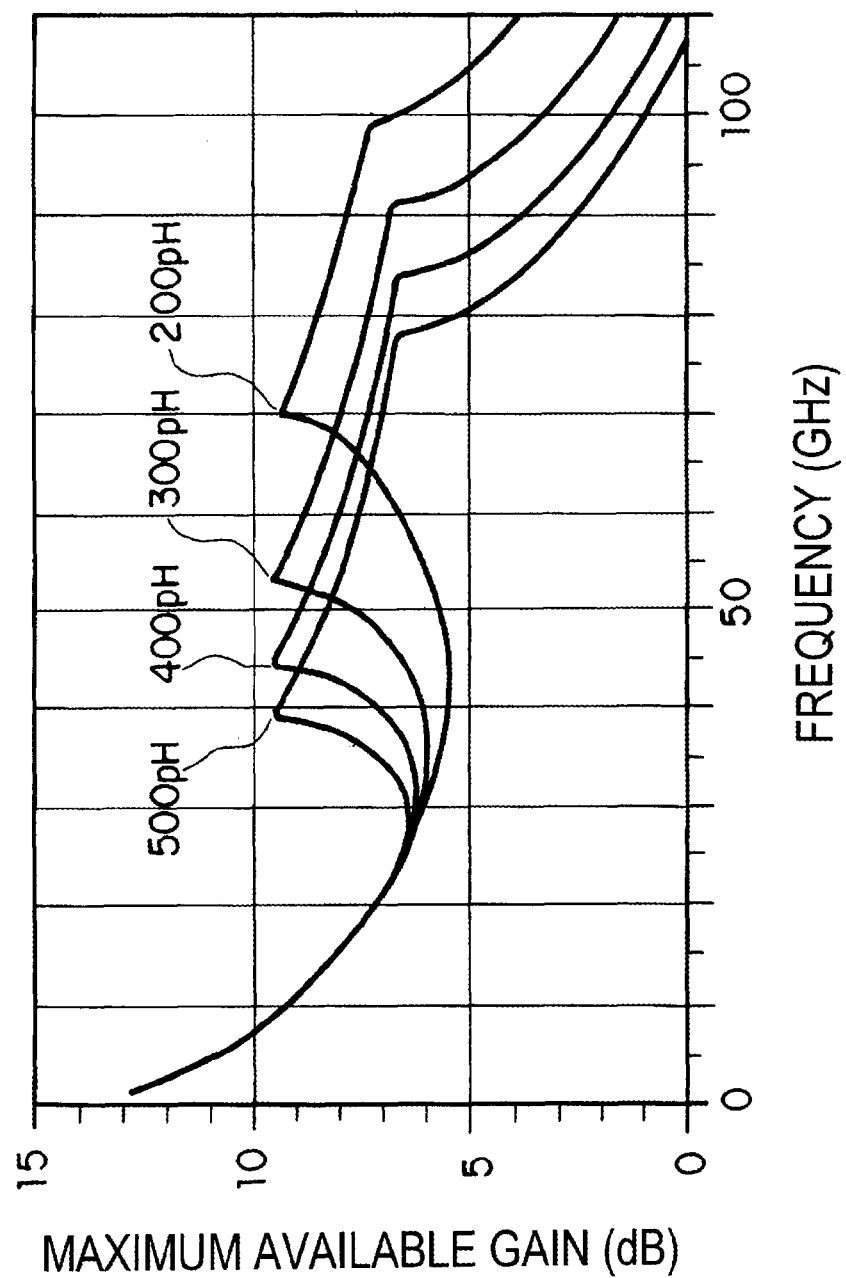
FIG. 7 illustrates frequency characteristics of the amplifier with a parameter of the primary inductance.

FIG. 7 illustrates frequency characteristics of the amplifier 2 with a parameter of the primary inductance $L_p$. The horizontal axis denotes an input signal frequency. The vertical axis denotes a maximum available gain. The primary inductance $L_p$ used in the simulation is attached to each frequency characteristic.

As depicted in FIG. 7, by adjusting the primary inductance $L_p$, it is possible to maximize the maximum available gain of the amplifier 2 within a desired frequency range. In the example depicted in FIG. 7, the primary inductance $L_P$ is adjusted so that the maximum available gain of the amplifier 2 is maximized at 40-70 GHz in the millimeter-wave band (30-300 GHz). It may also be possible to adjust the primary inductance $L_p$ so that the maximum available gain is maximized in other frequency ranges (for example, a higher frequency range in the millimeter-wave band or the microwave band (3-30 GHz)).

As depicted in FIG. 6, the gain 52 of the common-source amplifier extremely decreases in the range of 10-100 GHz. Therefore, preferably, the above-mentioned desired frequency range is higher than or equal to 10 GHz and lower than or equal to 100 GHz.

As described above, by adjusting the sizes of the primary coil 10 and the secondary coil 12, it is possible to set the peak frequency of the gain (frequency in which the gain is maximized) to be a desired frequency. The sizes of the primary coil 10 and the secondary coil 12 corresponding to the desired peak frequency are obtainable by simulation using a transistor model.

Figure 8A:
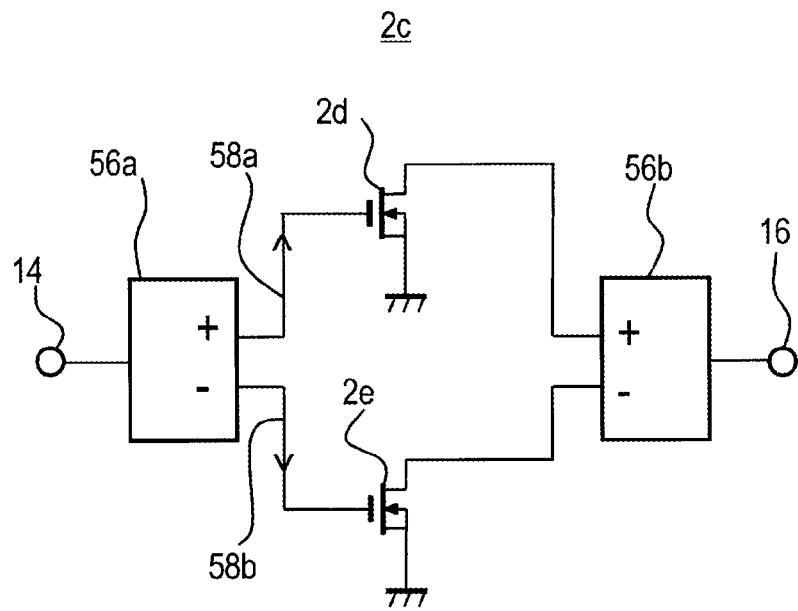
FIG. 8A is a diagram illustrating a cross-coupled differential amplifier.
Figure 8B:
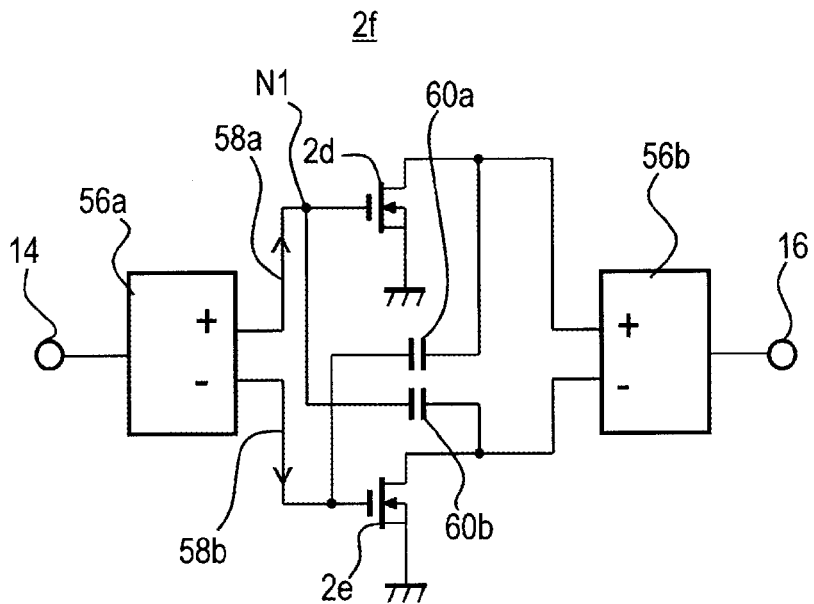
FIG. 8B is a diagram illustrating a cross-coupled differential amplifier.

FIGS. 8A and 8B are diagrams each illustrating a cross-coupled differential amplifier. In FIG. 8A, there is depicted a differential amplifier 2c which includes a pair of common-source amplifiers 2d, 2e. In FIGS. 8A and 8B, bias circuits etc. of the common-source amplifiers 2d, 2e are not illustrated.

As depicted in FIG. 8A, the differential amplifier 2c includes a first balun 56a, a first and a second common-source amplifier 2d, 2e and a second balun 56b. The first and second common-source amplifiers 2d, 2e are transistors including substantially equal parameter values.

The first and second baluns 56a, 56b are, for example, transformers in which the center portion of a secondary coil (a coil on a balance terminal side) is connected to the reference potential (refer to the transformer 4 depicted in FIG. 1). By the first balun 56a, an input signal is divided into a first signal 58a and a second signal 58b between which a phase difference is 180°. The divided first and second signals 58a, 58b are amplified by the first common-source amplifier 2d and the second common-source amplifier 2e, respectively. The second balun 56b outputs a difference between the amplified first and second signals 58a, 58b.

In FIG. 8B, there is depicted a cross-coupled differential amplifier 2f in which the common-source amplifiers 2d, 2e are cross-coupled by a first and a second cross-coupling capacitors 60a, 60b.

Now, a current flowing through the gate-to-drain capacitance (not illustrated) of the first common-source amplifier 2d will be derived hereafter. Let a voltage of the first signal 58a be $V_a(t)$, and a voltage gain of the first common-source amplifier 2d be $-A$, then a voltage $(1+A)V_a(t)$ is applied to both ends of the gate-to-drain capacitance. Therefore, a current having a current value of $C_{gd}(1+A)*dV_a(t)/dt$ flows through the gate-to-drain capacitance of the first common-source amplifier 2d. Here, $C_{gd}$ is the gate-to-drain capacitance.

With regard to the second cross-coupling capacitor 60b, one end thereof is connected to the gate of the first common-source amplifier 2d, while the other end is connected to the drain of the second common-source amplifier 2e. To the drain of the second common-source amplifier 2e, a signal which is $-A$ times the second signal 58b $(=-V_a(t))$ is output. Therefore, a current having a current value of $C_c(1-A)*dV_a(t)/dt$ flows through the second cross-coupling capacitor 60b. Here, $C_c$ is the capacitance of the second cross-coupling capacitor 60b (hereafter referred to as cross-coupling capacitance).

Now, it is assumed that a voltage amplification factor A is sufficiently larger than 1, and the gate-to-drain capacitance $C_{gd}$ of the first common-source amplifier 2d substantially equals the cross-coupling capacitance $C_c$. In such a case, a current supplied from the gate-to-drain capacitance to the gate side (namely, node N1) of the first common-source amplifier 2d is almost canceled by a current supplied from the second cross-coupling capacitor 60b to the node N1.

Here, the current supplied from the gate-to-drain capacitance to the node N1 is approximately $C_{gd}*dV_a(t)/dt$. On the other hand, the current supplied from the second cross-coupling capacitor 60b to the node N1 is approximately $-C_{gd}*dAV_a(t)/dt$.

Accordingly, when seen from the transformer 4, the gate-to-drain capacitance of the first common-source amplifier 2d amounts to non-existent, and therefore, the Miller effect of the first common-source amplifier 2d is suppressed.

Similarly, the Miller effect of the second common-source amplifier 2e is also suppressed, when the voltage amplification factor A is sufficiently larger than 1 and the capacitance of the first cross-coupling capacitor 60a substantially equals the gate-to-drain capacitance of the second common-source amplifier 2e.

Because of not using a resonance phenomenon, an effect of suppression of the Miller effect caused by the cross-coupling capacitance is independent of a frequency. Therefore, as depicted in FIG. 6, the gain 54 of the cross-coupled differential amplifier is larger than the gain 52 of the common-source amplifier over a wide frequency range of 20-110 GHz, for example.

The gain 50 of the amplifier 2 according to the embodiment is higher than a gain 54 of the cross-coupled differential amplifier at the peak frequency and in its vicinity (refer to FIG. 6).

(4) Gain Error

The gain of the cross-coupled differential amplifier becomes largest when the capacitance of the cross-coupling capacitor almost coincides with the gate-to-drain capacitance of each common-source transistor 2d, 2e.

Now, the gate-to-drain capacitance of a transistor is around 10 fF, for example. On the other hand, parasitic capacitance of around several fF accompanies the cross-coupling capacitor on a semiconductor substrate. Therefore, it is not easy to make the capacitance of the cross-coupling capacitor coincide with the gate-to-drain capacitance of each common-source transistor 2d, 2e.

Figure 9:
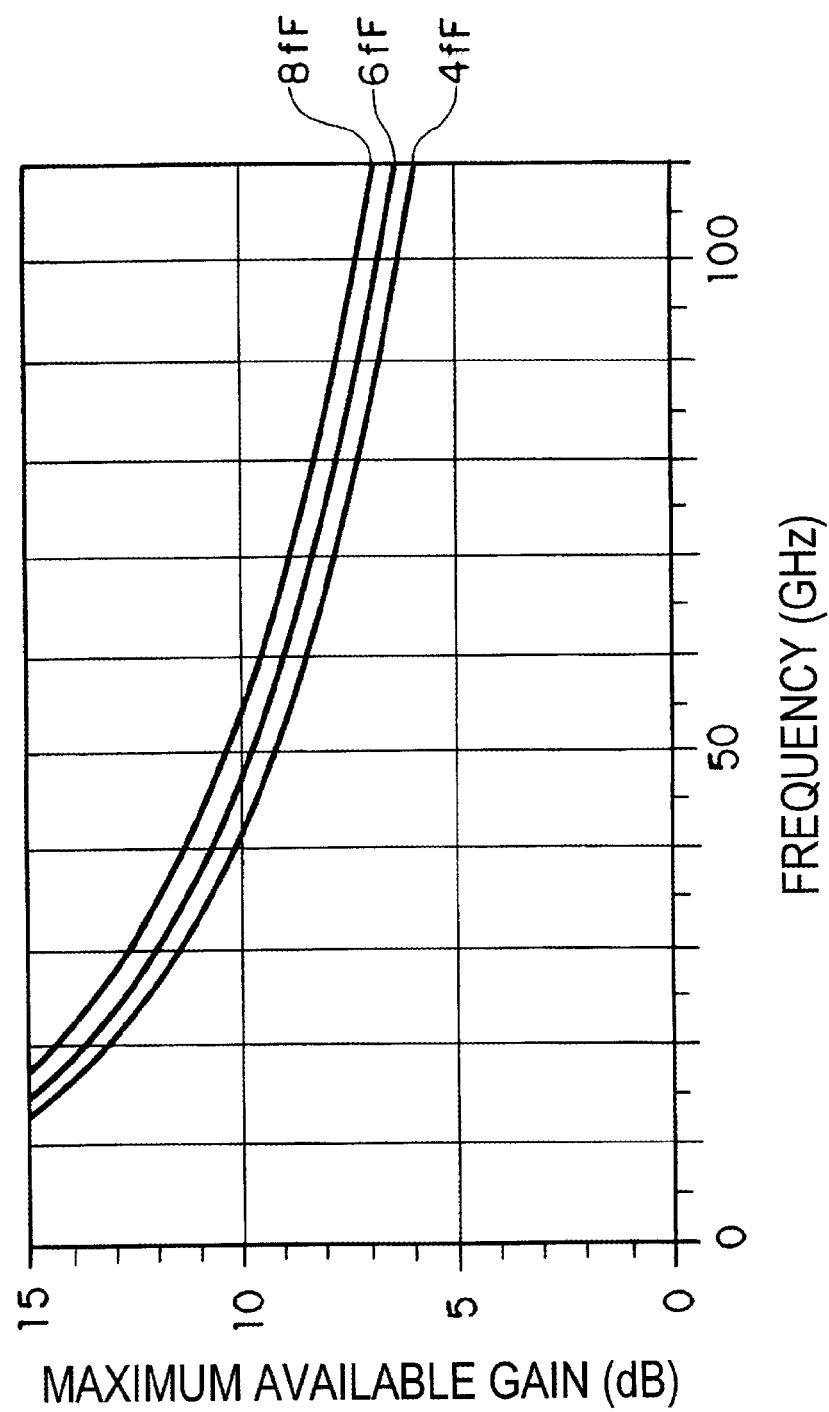
FIG. 9 illustrates frequency characteristics of the cross-coupled differential amplifier, with a parameter of the capacitance of the cross-coupling capacitor.

FIG. 9 illustrates frequency characteristics of the cross-coupled differential amplifier, with a parameter of the capacitance of the cross-coupling capacitor (including parasitic capacitance). The horizontal axis denotes an input signal frequency. The vertical axis denotes a maximum available gain. Here, it is assumed that the capacitance of each cross-coupling capacitor 60a, 60b is mutually equal. Also, it is assumed that the gate-to-drain capacitance of each common-source transistor 2d, 2e is mutually equal.

As depicted in FIG. 9, there is an approximately 2 dB difference between the maximum available gains for the case that a capacitance of the cross-coupling capacitor (hereafter referred to as cross capacitance) is 4 fF and the case that the cross capacitance is 8 fF. Because of difficulty to control the parasitic capacitance, for example, when a target value of the cross capacitance (including the parasitic capacitance) is set to 6 fF and the cross-coupling capacitor is formed according to the target value, resulting cross capacitance is dispersed on a range from 4 fF to 8 fF. Therefore, approximately 2 dB of dispersion is produced in the maximum available gain.

Here, in the simulation of FIG. 9, the target value of the cross capacitance is differentiated to some extent from the gate-to-drain capacitance. The reason is that if the capacitance values of the cross capacitance and the gate-to-drain capacitance are too close to each other, the amplifier becomes easy to oscillate.

In the amplifier 2 according to the embodiment, the Miller effect is suppressed by the primary inductance $L_p$ of the transformer 4. As described earlier, the primary inductance $L_p$ is determined by the sizes of the primary coil 10 and the secondary coil 12. In consideration of a processing accuracy of wiring, a manufacturing error of the primary inductance $L_p$ is as high as several percent.

Figure 10:
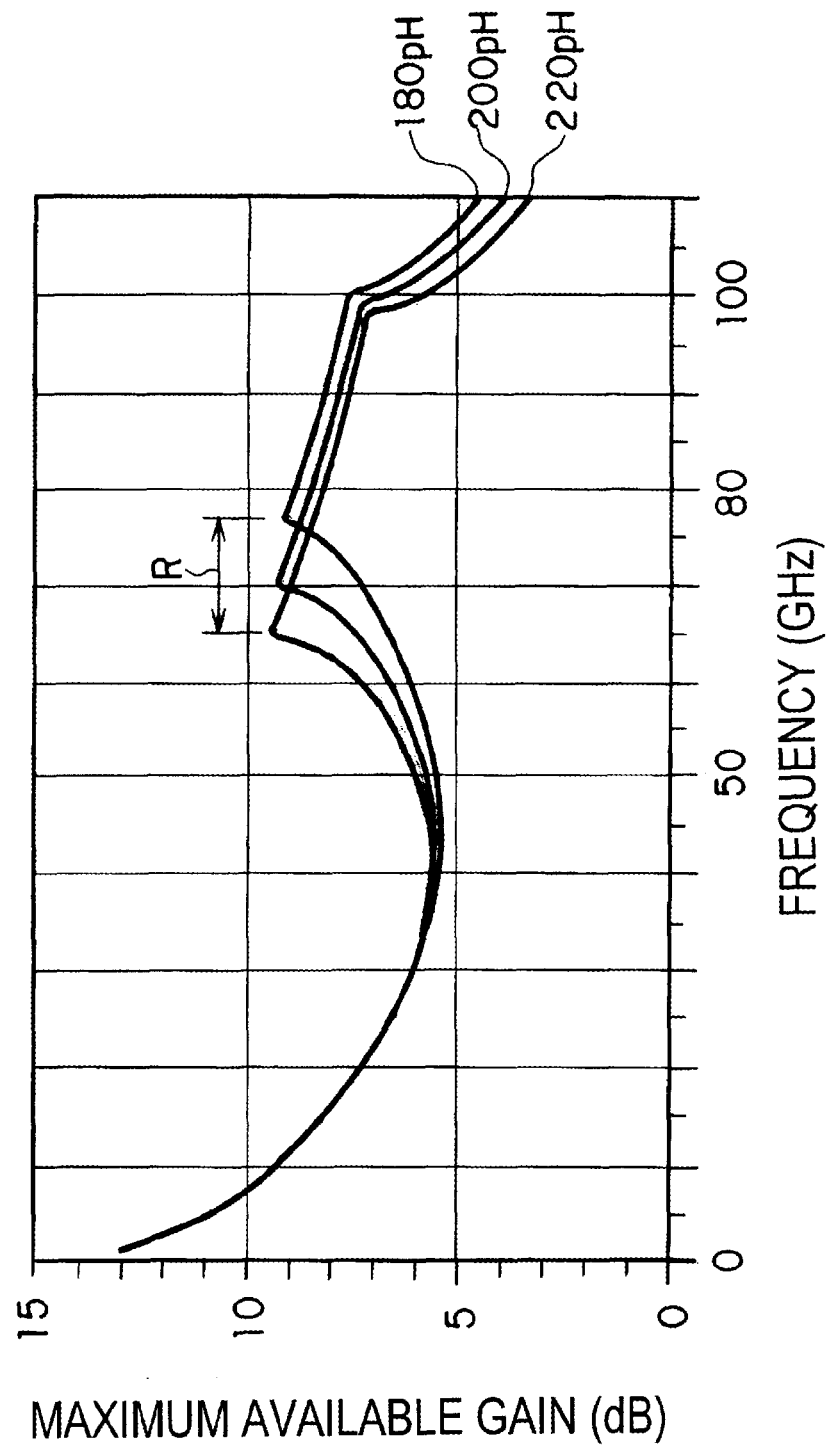
FIG. 10 illustrates a frequency characteristic of the amplifier according to the embodiment, with a parameter of the primary inductance.

FIG. 10 illustrates a frequency characteristic of the amplifier 2, with a parameter of the primary inductance $L_p$. The horizontal axis denotes an input signal frequency. The vertical axis denotes a maximum available gain.

Now, it is assumed that, if the target value of the primary inductance $L_P$ is set to 200 pH and the transformer 4 is formed according to the target value, the resulting primary inductance $L_p$ is dispersed on a range of 180-220 pH (that is, with an error of ±10%). In this case, the maximum available gain is maximized at a frequency range R of 65-77 GHz, as depicted in FIG. 10.

A difference of the maximum available gain at a frequency (for example, 80 GHz) on a higher frequency side than the frequency range R is around 1 dB at the maximum (refer to FIG. 10). The above dispersion is smaller than the dispersion (2 dB) of the maximum available gain in the cross-coupled differential amplifier. In short, by the amplifier 2 according to the embodiment, the dispersion of the maximum available gain (gain error) due to the manufacturing error is reduced.

(5) Gain Bandwidth

Figure 11:
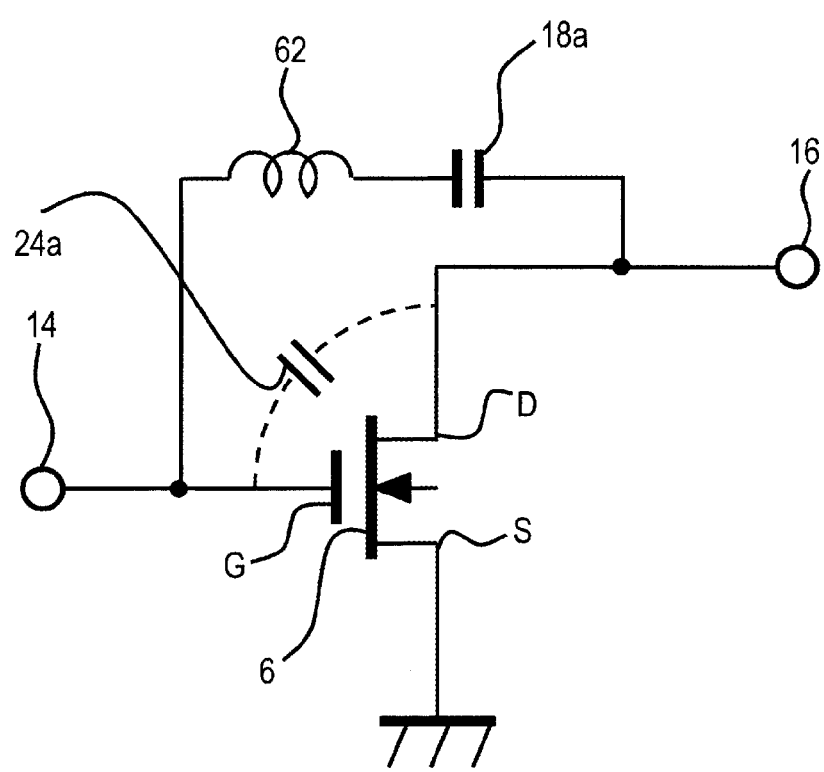
FIG. 11 illustrates a circuit diagram of a common-source amplifier in which a gate is connected to a drain by an inductor.

FIG. 11 illustrates a circuit diagram of a common-source amplifier 2g in which a gate G is connected to a drain D by an inductor 62. To the inductor 62, a capacitor 18a to cut off a power voltage (direct-current voltage) applied to the drain D is connected in series. Bias circuits etc. are not illustrated in FIG. 11.

Figure 12:
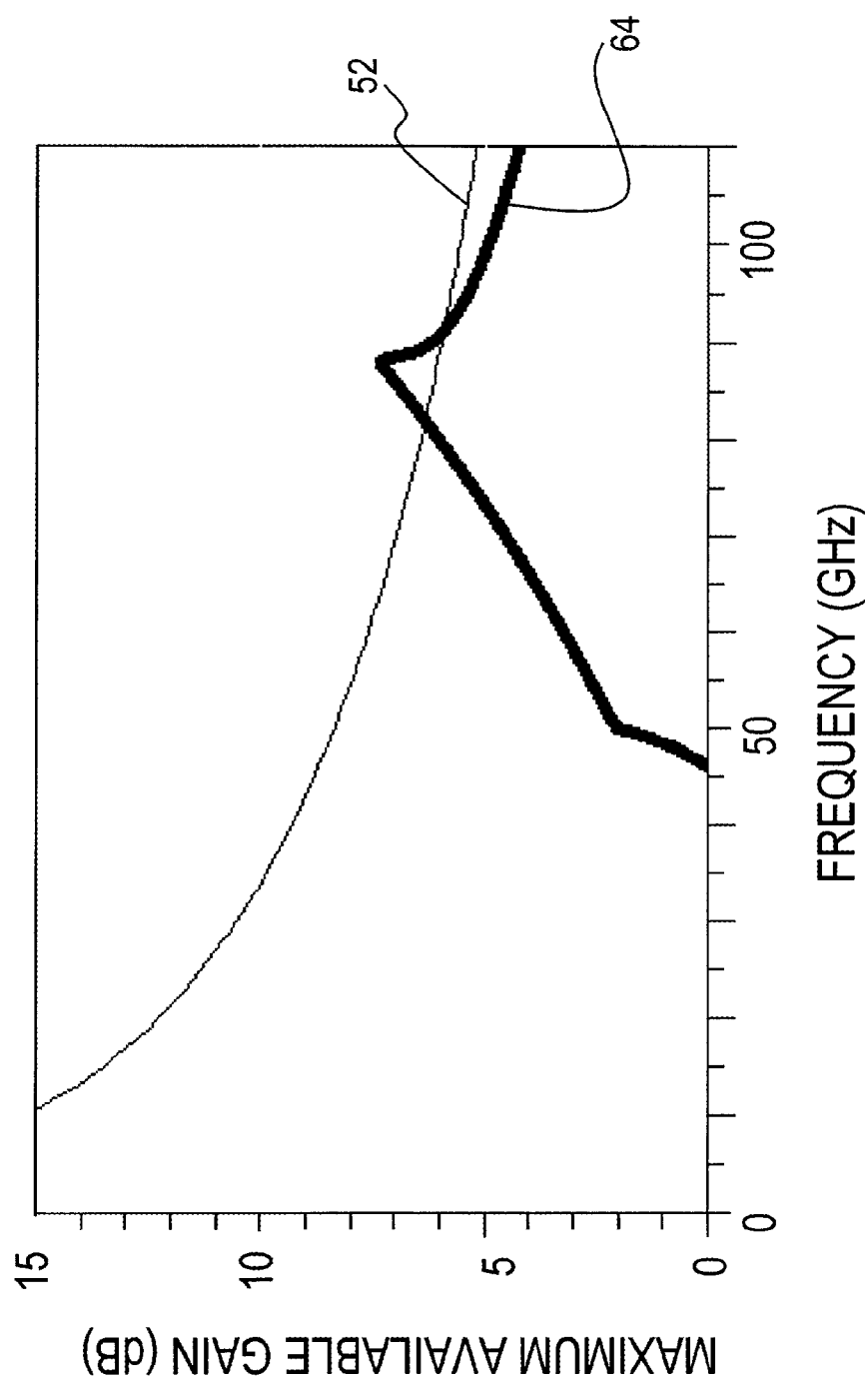
FIG. 12 illustrates a frequency characteristic of the common-source amplifier depicted in FIG. 11.

FIG. 12 illustrates a frequency characteristic 64 of the common-source amplifier 2g depicted in FIG. 11. In FIG. 12, a frequency characteristic 52 of a common-source amplifier without the inductor 62 (refer to FIG. 3A) is also depicted.

As depicted in FIG. 12, the maximum available gain is increased in a high frequency range (in the vicinity of 88 GHz in FIG. 12) even if the gate G and drain D of the transistor 6 are connected by the inductor 62. The reason is that, by the resonance of the inductor 62 with the gate-to-drain capacitance 24a, the Miller effect is suppressed.

However, on the lower frequency side than the peak frequency, the frequency characteristic 64 of the common-source amplifier 2g is sharply decreased to 0 dB or less.

In contrast, the frequency characteristic of the amplifier 2 according to the embodiment provides a sufficiently large gain even on the lower frequency side than the peak frequency, as depicted in FIGS. 6 and 7. Therefore, the amplifier 2 according to the embodiment is more excellent than the common-source amplifier 2g in which the gate and the drain are connected by the inductor 62.

In the common-source amplifier 2g depicted in FIG. 11, when the frequency is high, the impedance of the inductor 62 becomes high and the impedance of the capacitor 18a becomes low. In this case, an influence of the capacitor 18a upon a circuit characteristic is small, and the inductor 62 resonates with the gate-to-drain capacitance 24a.

On the other hand, in the case of a low frequency, the impedance of the inductor 62 becomes low and the impedance of the capacitor 18a becomes high. In this case, an influence of the inductor 62 upon the circuit characteristic is small, and the capacitor 18a becomes equivalent to a capacitor whose capacitance is (1+A) times as large as the capacitance of the capacitor 18a and which connects the gate G of the transistor 6 to the reference potential. Accordingly, the gain of the common-source amplifier 2g sharply decreases on the lower frequency side than the peak frequency.

(6) Suppression of Noise

Figure 13:
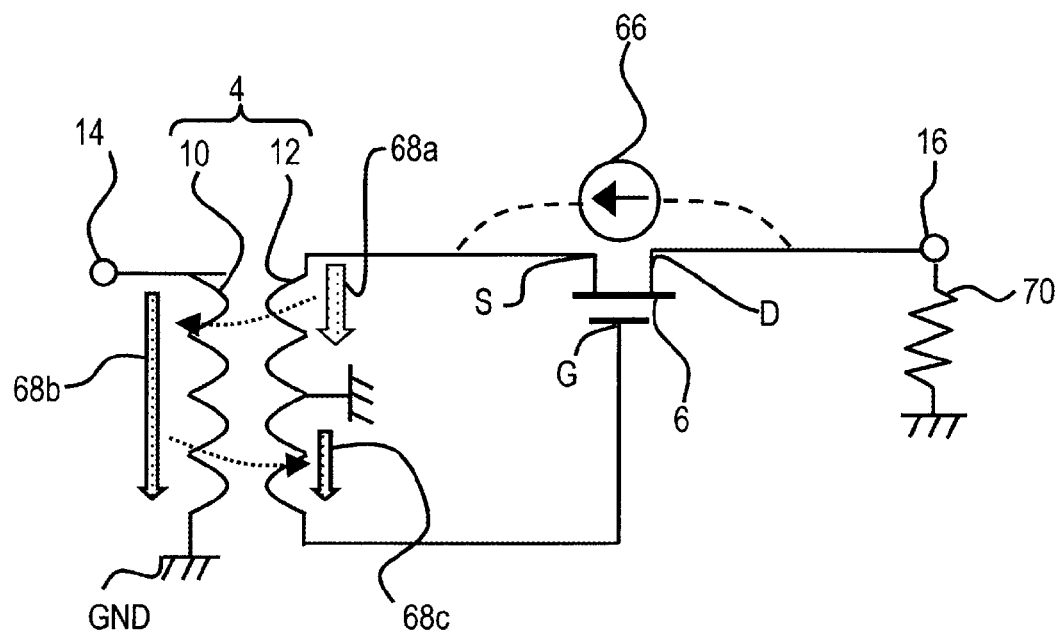
FIG. 13 illustrates an equivalent circuit of the amplifier when noise of the transistor is taken into consideration.

FIG. 13 illustrates an equivalent circuit of the amplifier 2 when noise of the transistor 6 is taken into consideration. In the circuit depicted in FIG. 13, a noise current source 66 is provided between the source S and the drain D of the transistor 6. In FIG. 13, bias circuits etc. are not illustrated.

Current 68a generated by the noise current source 66 (hereafter referred to as primary noise current) flows into a secondary coil 12, and is absorbed into the reference potential (ground GND in FIG. 13) connected to the center of the secondary coil 12.

At this time, a secondary noise current 68b is generated in the primary coil 10 by magnetic coupling. By the magnetic coupling with the secondary noise source 68b, a tertiary noise current 68c is generated in the secondary coil 12. The tertiary noise current 68c flows into the gate G, so that the gate-to-source capacitance is charged (or discharged).

By the above charge/discharge of the tertiary noise current 68c, a noise voltage is generated between the gate and the source. In response to the noise voltage, the transistor 6 generates a noise current (hereafter referred to as feedback noise current).

Figure 14A:
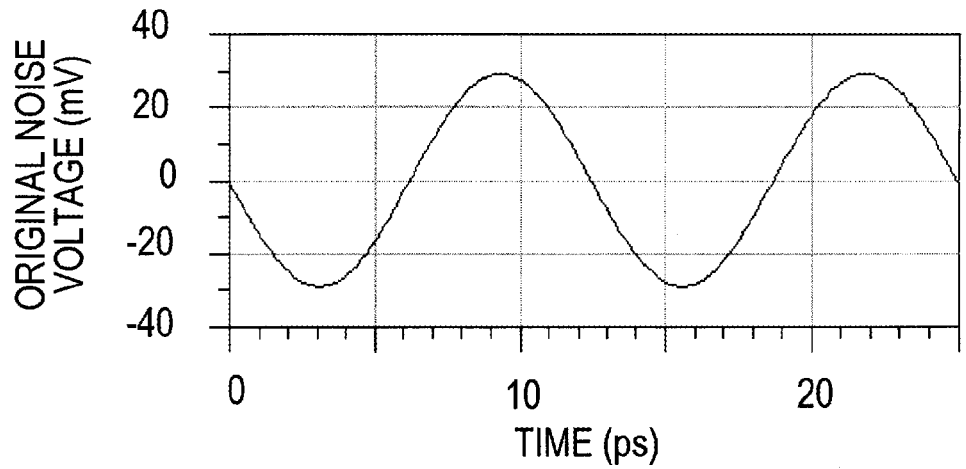
FIG. 14A is a diagram illustrating a noise voltage output from the output port.
Figure 14B:
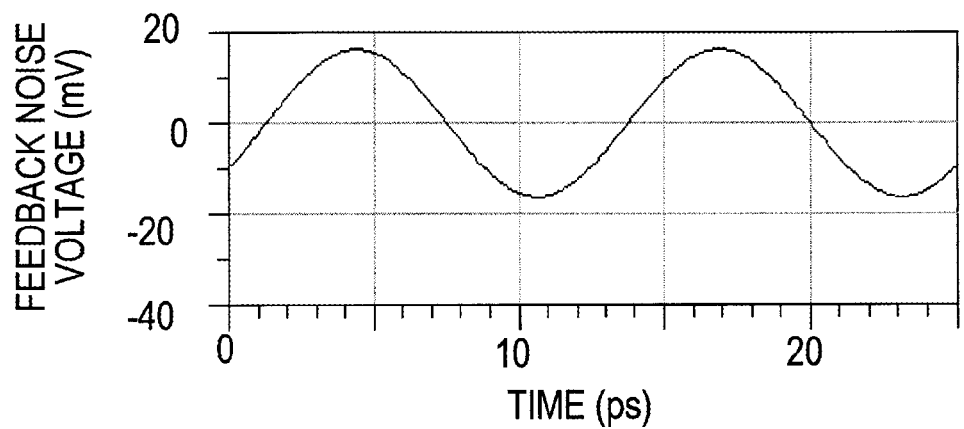
FIG. 14B is a diagram illustrating a noise voltage output from the output port.
Figure 14C:
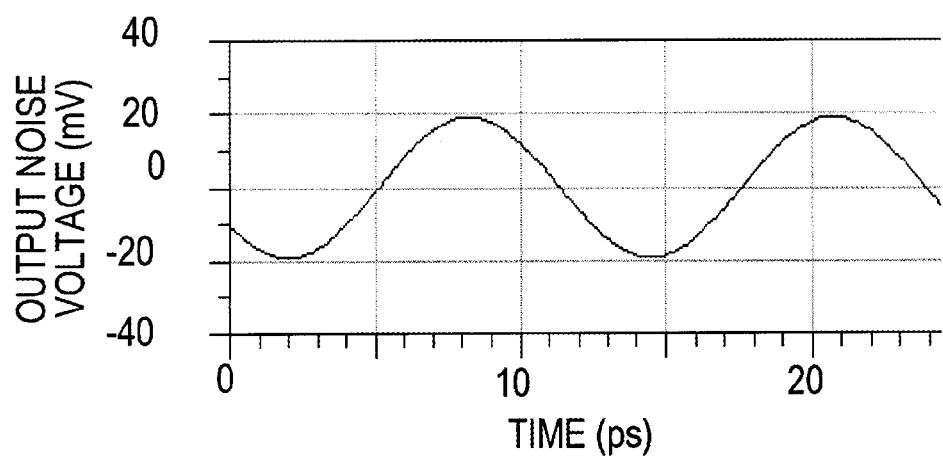
FIG. 14C is a diagram illustrating a noise voltage output from the output port.

FIGS. 14A-14C are diagrams illustrating noise voltages output from the output port 16. The horizontal axes of FIGS. 14A-14C denote time. The vertical axes of FIGS. 14A-14C denote voltage.

FIGS. 14A-14C are obtained from simulation when a load (in particular, a resistor of 50Ω) 70 is connected to the output port 16 (refer to FIG. 13).

The noise current flowing out of the noise current source 66 returns to the noise current source 66 through the reference potential. Therefore, the primary noise current 68a and the feedback noise current (not illustrated) flow into the load 70.

In FIG. 14A, a noise voltage (hereafter referred to as original noise voltage) generated at the load resistor 70 by the primary noise current 68a is depicted. In FIG. 14B, a noise voltage (hereafter referred to as feedback noise voltage) generated at the load resistor 70 by the feedback noise current is depicted.

In FIG. 14C, a noise voltage (hereafter referred to as output noise voltage), which is produced by combining the original noise voltage with the feedback noise voltage, is depicted. The noise voltage output from the output port 16 is the above output noise voltage.

Now, noise includes signals of a variety of frequencies. FIGS. 14A-14C indicate signal voltages at a frequency 80 GHz among signal voltages at various frequencies included in the noise voltage.

As depicted in FIGS. 14A and 14B, the feedback noise voltage deviates approximately 180° in phase from the original noise voltage. Therefore, the output noise voltage becomes smaller than the original noise voltage, as depicted in FIG. 14C.

As described above, the original noise voltage is a noise voltage output from the common-source amplifier. Therefore, the output noise voltage (noise voltage output from the output port 16) is smaller than the noise voltage generated by the common-source amplifier.

In conclusion, the noise voltage output from the amplifier 2 according to the embodiment is smaller than the noise voltage of the common-source amplifier.

(7) Deformation Examples

Figure 15:
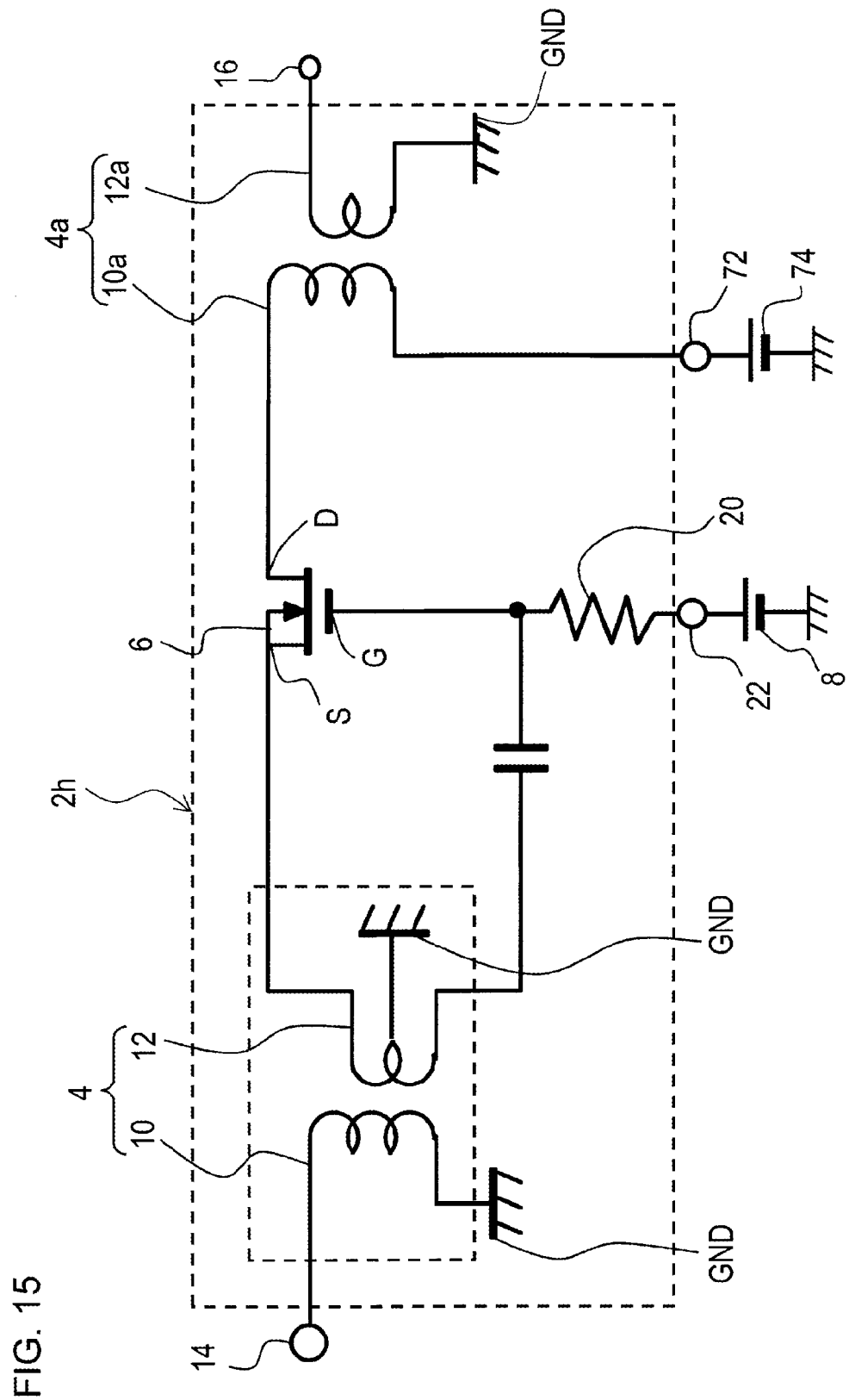
FIG. 15 is a diagram illustrating a first deformation example.

FIG. 15 is a diagram illustrating a first deformation example.

An amplifier 2h depicted in FIG. 15 further includes another transformer 4a which is different from the transformer 4 in the amplifier 2 depicted in FIG. 1. In FIG. 15, a drive power supply 74 of the transistor 6 is also depicted.

As depicted in FIG. 15, the transformer 4a includes a primary coil 10a and a secondary coil 12a.

One end of the primary coil 10a is connected to the drain D of the transistor 6. The other end of the primary coil 10a is connected to the drive power supply 74 of the transistor 6 through a power port 72.

The secondary coil 12a is a coil magnetically-coupled with the primary coil 10a. One end of the secondary coil 12a is connected to the output port 16, while the other end is connected to the reference potential.

According to the amplifier 2h depicted in FIG. 15, it is possible to separate a signal amplified by the transistor 6 from the drive voltage of the transistor 6.

Figure 16:
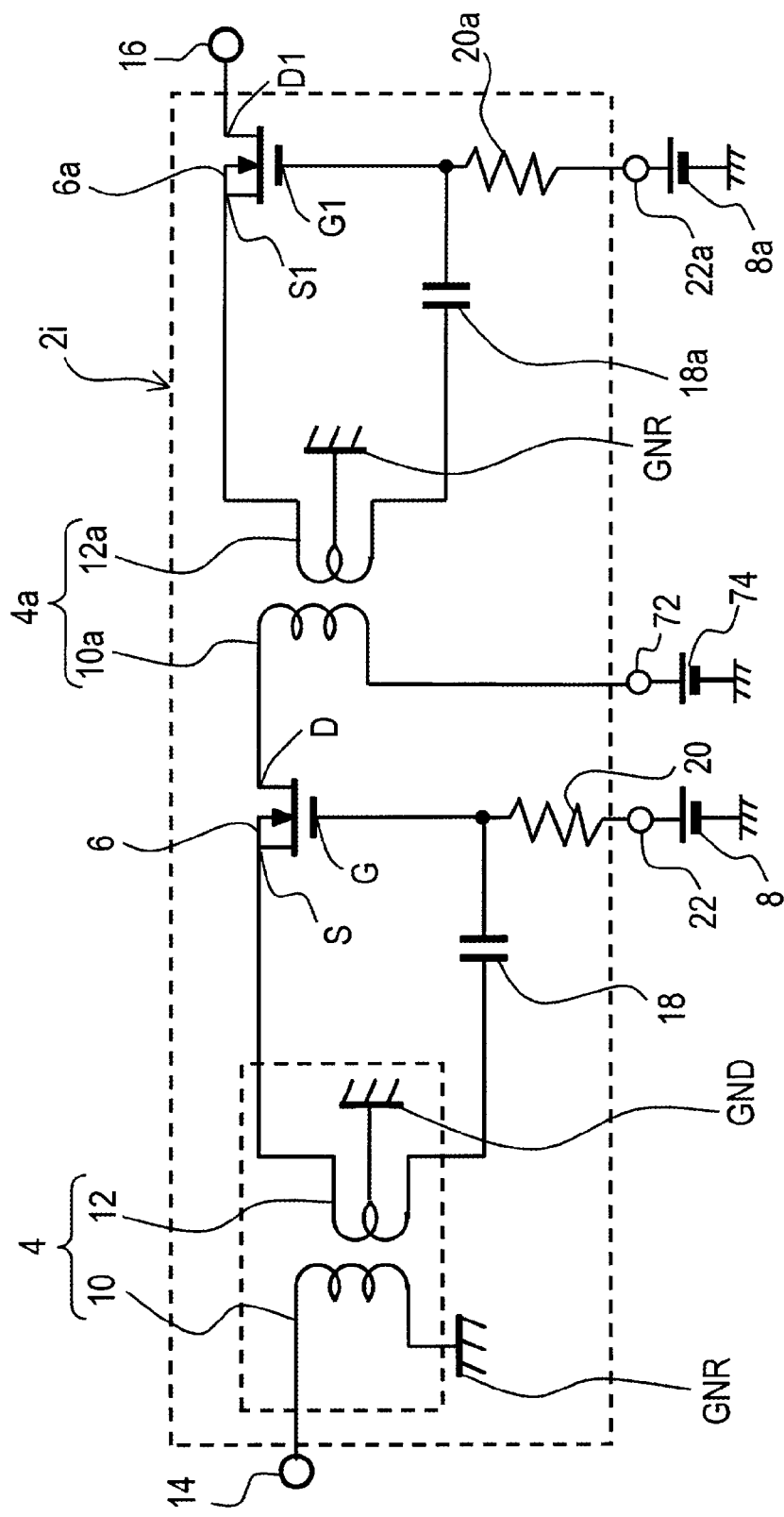
FIG. 16 is a diagram illustrating a second deformation example.

FIG. 16 is a diagram illustrating a second deformation example.

An amplifier 2i depicted in FIG. 16 further includes another transistor 6a which is different from the transistor 6 in the amplifier 2h depicted in FIG. 15.

As depicted in FIG. 16, the transistor 6a includes a source S1 connected to one end of the secondary coil 12a of the transformer 4a, a gate G1 connected to the other end of the secondary coil 12a, and a drain D1 connected to the output port 16.

As depicted in FIG. 16, the amplifier 2i further includes a capacitor 18a and a resistor 20a. A center portion of the secondary coil 12a is connected to the reference potential. Accordingly, a high frequency signal output from the transformer 4a is supplied between the gate G1 and the source S1 of the transistor 6a, but is hardly supplied to a bias power supply 8a.

As depicted in FIG. 16, in the amplifier 2i, each amplifier 2 depicted in FIG. 1 is connected in cascade. Therefore, a gain of the amplifier 2i is higher than the gain of the amplifier 2 depicted in FIG. 1.

In the above examples, the center portions of the secondary coils 12, 12a are connected to the reference potential. However, each connection point to the reference potential may be any point between each source S, S1 and each capacitor 18, 18a (including an inside of each secondary coil). The reason is that the reference potential is connected to supply a bias voltage to the gate of each transistor 6, 6a.

Further, in the above examples, each resistor 20, 20a is connected to each bias port 22, 22a to cut off high frequency signals. However, it may also be possible to provide short stubs in place of the resistors 20, 20a.

Also, in the above examples, the transistor 6 is a MOS field effect transistor. However, in place of the MOS field effect transistor, a different transistor (for example, high electron mobility transistor) may also be used.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An amplifier comprising:
    a transformer including a primary coil whose one end is connected to an input port and whose other end is connected to reference potential, and a secondary coil whose center portion is connected to the reference potential and which is magnetically-coupled with the primary coil;
    a transistor including a source connected to one end of the secondary coil whose center portion is connected to the reference potential, a gate connected to other end of the secondary coil and a drain connected to an output port side;
    another transformer which includes:
        another primary coil whose one end is connected to the drain of the transistor and which is different from the primary coil; and
        another secondary coil which is magnetically-coupled with the another primary coil and which is different from the secondary coil; and
    another transistor which includes a source connected to one end of the another secondary coil, a gate connected to other end of the another secondary coil, and a drain connected to the output port side,
    wherein the other end of the another secondary coil is disconnected from the reference potential.

2. The amplifier according to claim 1,
    wherein the transformer has primary inductance to maximize a maximum available gain of the amplifier in a desired frequency range.

* * * * *